United States Patent

Neuman

[15] 3,644,847

[45] Feb. 22, 1972

[54] FREQUENCY-FOLLOWING VOLTAGE-CONTROLLED FILTER PROVIDING SUBSTANTIALLY CONSTANT OUTPUT AMPLITUDE

[72] Inventor: John G. Neuman, Gross Pointe Woods, Mich.

[73] Assignee: General Motors Corporation, Detroit, Mich.

[22] Filed: Nov. 30, 1970

[21] Appl. No.: 93,583

[52] U.S. Cl. ..................................333/17, 328/137, 328/167

[51] Int. Cl. ..................................H03h 7/10

[58] Field of Search ..............333/17, 70 R; 334/11; 328/137, 328/140, 164, 173, 175, 167; 307/264, 265

[56] References Cited

UNITED STATES PATENTS

| | | | |
|---|---|---|---|
| 2,976,408 | 3/1961 | Colaguori | 328/140 X |
| 3,314,026 | 4/1967 | Maynard | 333/70 R X |
| 3,316,497 | 4/1967 | Brooks | 333/70 R X |

*Primary Examiner*—Herman Karl Saalbach
*Assistant Examiner*—Paul L. Gensler
*Attorney*—E. W. Christen and C. R. Meland

[57] ABSTRACT

A filter arrangement for extracting the fundamental frequency from an input periodic electrical signal controlled to follow changes in frequency by the input electrical signal to provide an output sinusoidal signal whose frequency continuously follows the frequency of the input signal. This filter arrangement includes a voltage-controlled filter in combination with a feedback loop comprising an amplitude sensing circuit, a voltage comparator and an amplifier to provide an error signal related to the difference between the instantaneous output voltage of the voltage-controlled filter and a reference voltage. This error signal is applied to the voltage-controlled filter to modify its characteristic response and, accordingly, to enable the voltage-controlled filter to extract a fundamental frequency sinusoid which follows frequency changes by the input signal. Additionally, the instant filter arrangement inherently adjusts for variations in the amplitude of the input signal to effect automatic gain control providing a substantially constant amplitude output voltage.

4 Claims, 5 Drawing Figures

INVENTOR.
John G. Neuman
BY
C. R. Meland
ATTORNEY

INVENTOR.
John G. Neuman
BY
C. R. Meland
ATTORNEY

FREQUENCY-FOLLOWING VOLTAGE-CONTROLLED FILTER PROVIDING SUBSTANTIALLY CONSTANT OUTPUT AMPLITUDE

This invention relates to a filter arrangement which provides an output whose frequency follows the frequency of an input signal and whose amplitude is maintained substantially constant.

Voltage-controlled filters are generally known for applications in which it is desirable to control the filter characteristic response according to a bias voltage. These arrangements have general application as is known to those skilled in the art. By monitoring the phase of the output voltage from a voltage-controlled filter, control of the characteristic response of a voltage-controlled filter has been effected, in the past, to provide a filter system extracting a fundamental frequency signal from a periodic input wherein the frequency of the extracted signal follows the frequency of the input signal. This known phase sensing arrangement involves a complicated phase analysis, and the output voltage amplitude is sensitive to fluctuations by the input voltage amplitude. The amplitude fluctuations cannot be internally compensated by this known filtering arrangement and consequently, the output voltage amplitude fluctuates in the same manner as the input voltage amplitude.

In contrast with known uses for voltage-controlled filters including the phase detecting feedback application, the filter of the instant invention contemplates using a low-pass voltage-controlled filter in a feedback arrangement wherein the output voltage level from the voltage-controlled filter is sensed to generate a bias voltage for controlling the filter's characteristic response. By this novel arrangement, an output signal is extracted from an input signal whose frequency follows the frequency of the input signal, while the amplitude of the output signal is maintained substantially constant being insensitive to variations in amplitude on the part of the input signal.

To generate the requisite bias or control voltage, a voltage-sensing circuit is connected with the output of the voltage-controlled filter to sense the amplitude of the output voltage from the voltage-controlled filter. This sensed voltage is then compared with a reference voltage amplitude to generate an error signal which is connected through an amplifier stage with the control terminals of the voltage-controlled filter to provide a signal to control the characteristic response of the voltage-controlled filter. The resultant filter provides an output signal whose frequency follows the frequency of the input signal and whose amplitude is maintained substantially constant as a result of the regulated gain noted above, all of which is more thoroughly discussed hereinafter.

Accordingly, it is an object of the present invention to provide a filter method and apparatus to extract the fundamental frequency from a variable-frequency input signal by controlling the characteristic response of a voltage-controlled filter.

Another object of the present invention is to provide a filter circuit including a voltage-controlled filter to extract the fundamental frequency from a variable-frequency input signal by sensing the output voltage from the voltage-controlled filter and connecting an error signal related thereto with the control terminals of the voltage-controlled filter to control the characteristic response of the voltage controlled filter.

Still another object of the present invention is to provide a filter arrangement including a voltage controlled filter wherein a control signal is derived from the filter's output signal for connection with the control terminals of the voltage-controlled filter to continually adjust the characteristic response of the voltage-controlled filter to extract an output signal from an input signal wherein the output signal has a constant amplitude and the same frequency as the fundamental harmonic of the input signal.

Further objects and advantages of the present invention will be apparent in light of the following description. The figures listed below are incorporated in the description and illustrate a preferred embodiment of the present invention.

Figure 1:
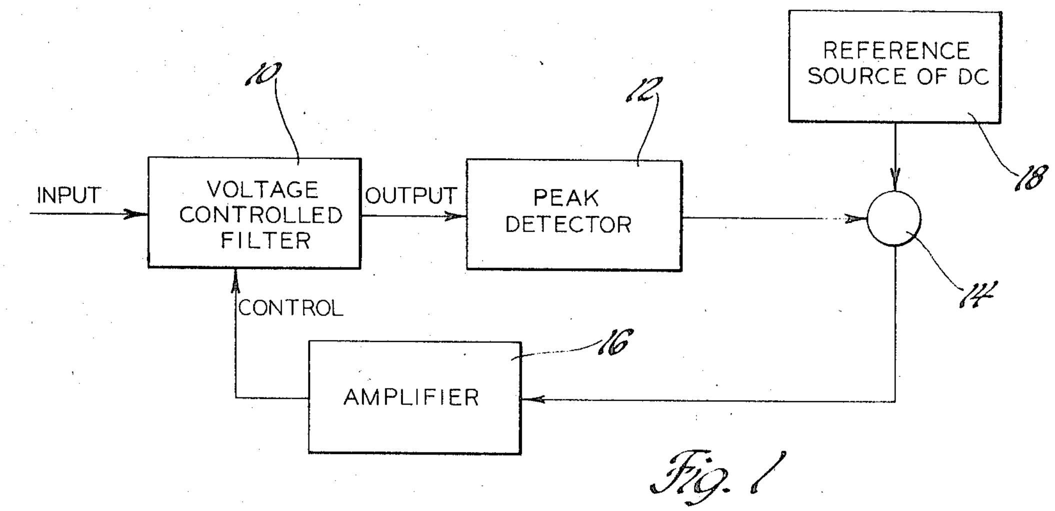
FIG. 1 is a block diagram schematic of the filter arrangement of this invention.

Reference should now be made to the drawings and more particularly to FIG. 1 wherein a block diagram of the filter arrangement of this invention is shown including a low-pass voltage-controlled filter 10 having input, output and control terminals. A typical catalog number for a voltage-controlled filter of the type required is Aritech Corporation No. 24 BLP 100–5000/0. It should be appreciated that a variety of periodic signals may be connected to the input of the voltage-controlled filter 10 including, but not limited to, square wave, pulse or triangular wave signals. Inasmuch as the precise character of the periodic waveform is unimportant to this invention and the source of that waveform is likewise unimportant, no source is illustrated in the drawing. For convenience, in considering the following explanation, it can be assumed that the periodic waveform connected at the input of the voltage-controlled filter 10 is a square wave. A feedback loop interconnects the output terminals of the voltage-controlled filter 10 with the control terminals of the filter. This feedback loop includes a peak detector 12, a voltage comparator 14 and a voltage amplifier 16. The peak detector 12 senses the voltage available at the output of the voltage-controlled filter 10 and connects this sensed voltage with the voltage comparator 14 where the sensed voltage is compared with a reference voltage supplied by the reference source of direct voltage 18. Voltage comparator 14 provides an error signal related to the difference between the sensed voltage and the reference voltage. This error signal is amplified by the amplifier 16 and connected with the control terminals of the voltage-controlled filter 10 to determine the instantaneous characteristic response of the voltage controlled filter 10.

The detector 12 can take a variety of known forms including the peak detector disclosed in FIG. 2 and described hereinafter. In addition, by proper calibration, other detectors such as an average or an RMS detector could be substituted for the peak detector. To generate the error signal related to the sensed voltage, the reference source of direct voltage 18 can take the form of a battery or the bridge rectified output of an alternating current source. The character of this source 18 is not illustrated in the drawings. The voltage comparator 14 can take a variety of known forms including the arrangement of FIG. 2 wherein an operational differential amplifier is used to amplify and sense the error voltage. The amplifier 16 likewise can take a variety of forms known to those skilled in the art, in addition to the operational amplifier shown in FIG. 2.

Figure 2:
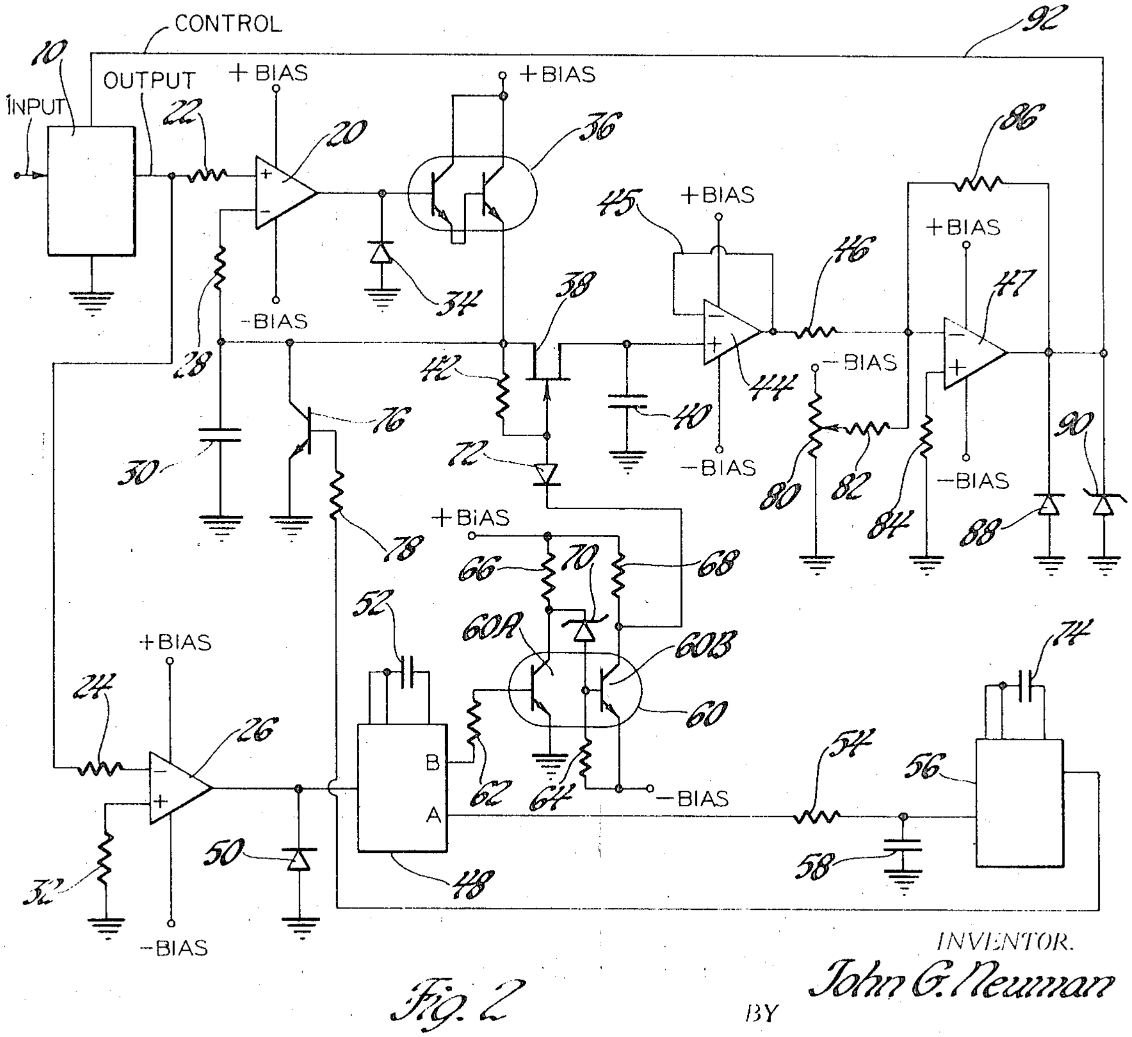
FIG. 2 is a circuit schematic of the filter arrangement of FIG. 1 showing in detail the control loop.

In FIG. 2, the voltage-controlled filter 10 provides an output signal which is connected with an operational amplifier 20 by means of a resistor 22. Additionally, the output signal is connected through resistor 24 with a second operational amplifier 26. The two operational amplifiers 20 and 26 are supplied positive and negative bias voltages from a bias supply which is not illustrated. This bias supply can take a variety of known forms including a conventional storage battery or the bridge rectified output of an alternating current source. All of the bias voltages in the FIG. 2 schematic are of equal amplitude having either positive or negative polarity and are indicated on the drawing by +BIAS or −BIAS markings. It should be appreciated that different bias voltages would be required for systems using elements different from those shown. This is not a problem, however, inasmuch as a circuit designer can readily adapt known systems to this application. Each of the operational amplifiers 20 and 26 has a second input and these inputs are connected as follows: operational amplifier 20 is connected through a resistor 28 and a capacitor 30 with ground, and operational amplifier 26 is connected through resistor 32 to ground.

Operational amplifiers 20 and 26 are conventional amplifiers available as packaged amplifier units. A typical catalog number for operational amplifiers of the type required is Fairchild Semiconductor No. μA 741C. In operation, the operational amplifiers 20 and 26 are connected in the circuit of FIG. 2 to provide either a positive or negative output voltage depending on the polarity of the input signals connected with the two inputs. Positive and negative input polarity markings are shown on the drawing, and the respective operational amplifiers provide positive output voltages when the input connected with the positive input is in fact positive with respect to the input connected with the negative input. On the other hand, if the negative input is provided a voltage more positive than that supplied the positive input, then the operational amplifier will provide a negative output voltage.

A diode 34 connects the output of operational amplifier 20 with ground and, accordingly, constrains the output of operational amplifier 20 to positive voltages, bypassing negative voltages directly to ground. A Darlington amplifier 36 is connected with the output of the operational amplifier 20 to afford current amplification of the output of the operational amplifier 20. This Darlington amplifier 36 is provided a positive bias at its collector terminal as indicated in the drawing. The base terminal of the amplifier 36 is connected with the output of the operational amplifier 20, and its emitter terminal is connected with the capacitor 30.

Capacitor 30 is charged by the amplifier 36 such that its voltage follows the instantaneous positive voltage applied to the positive terminal of the operational amplifier 20. A signal indicative of the voltage on capacitor 30 is connected with the negative terminal of the operational amplifier 20. If the positive terminal of operational amplifier 20 is supplied a voltage more positive than the voltage of the capacitor, the amplifier 20 has a positive output voltage which switches the amplifier 36 conductive to charge the capacitor 30. Of course, if the voltages at the positive and negative input terminals are equal or if the voltage at the negative terminal is more positive than the voltage of the positive terminal, the amplifier 36 will be nonconductive since the output from amplifier 20 will be zero. This charging, sensing arrangement permits the capacitor to be charged each cycle of the output voltage from the voltage controlled filter 10 to the peak voltage of the cycle. The capacitor 30 is discharged intermediate successive cycles to reset the capacitor 30 in a manner discussed hereinafter.

A field effect transistor 38 connects the capacitor 30 with another capacitor 40. The capacitor 40 has a capacitance substantially smaller than the capacitance of capacitor 30. For example, capacitor 30 may be on the order of 0.50 mfd., and capacitor 40 may be on the order of 0.01 mfd. Thus, when the field effect transistor 38 is switched on to connect the two capacitors, they both will be charged substantially to the voltage level of the capacitor 30. The control of field effect transistor 38 is described hereinafter. A resistor 42 connects the source and gate terminals of the field effect transistor 38.

The capacitor 40 is connected with the positive input of an operational amplifier 44. This amplifier 44 is provided positive and negative bias voltages as shown. This amplifier 44 is similar to the operational amplifiers 20 and 26; however, to derive an output voltage signal that follows the voltage of the capacitor 40, a conductor 45 connects the output with the negative input terminal, and the operational amplifier 44 operates as a voltage follower. To obviate discharging capacitor 40 through the amplifier 44, an amplifier with a high input impedance is required. A typical catalog number of suitable specification is Fairchild Semiconductor No. μA 740. As noted, conductor 45 connects the output of the amplifier 44 with the negative input terminal of the amplifier, and the amplifier functions as a voltage follower whose output voltage is the same as the voltage of the capacitor 40. In this manner, the operational amplifier 44 provides a voltage for connection with an operational amplifier 46 through a resistor 46 which is related to the peak voltage of the immediately preceding cycle of the output voltage of the voltage controlled filter 10. Operational amplifier 47 is identical to operational amplifiers 20 and 26. This amplifier 47 is connected in the circuit to perform as a conventional amplifier affording a gain factor to amplify signals connected with its input. It is provided positive and negative bias voltage as shown. The further processing required to develop a control signal for connection with the voltage controlled filter is described below. First, the circuitry required to maintain the capacitor 40 at the voltage level of the peak of the immediately preceding cycle of the output of the voltage controlled filter 10 will be described.

The output signal from operational amplifier 26 is coupled with a monostable multivibrator 48 to control the output pulses available from this multivibrator. A diode 50 provides a path to ground constraining the output from the amplifier 26 to positive voltages. A timing capacitor 52 determines the length of the pulses available from the monostable multivibrator 48, and a resistor 54 connects one output A of the monostable multivibrator 48 with a second monostable multivibrator 56. A capacitor 58 is included to provide a time delay in the application to the multivibrator 56 of pulses from the output A of multivibrator 48. A two transistor amplifier unit 60 including the transistors 60A and 60B is connected with the output B of the monostable multivibrator 48 through a resistor 62. Positive and negative bias voltage is applied to the two transistor amplifier 60. Three resistors 64, 66 and 68 and a Zener diode 70 complete the connections for the amplifier 60. The transistor amplifier 60 periodically supplies a control signal to the gate of the field effect transistor 38 through a diode 72. Monostable multivibrator 56 periodically provides an output pulse, having a width determined by capacitor 74, to a transistor 76 through a resistor 78. The two monostable multivibrators 48 and 56 are conventional units, and Motorola's multivibrator having catalog designation MC 667 is typical for both the multivibrators 48 and 56.

Operational amplifier 26 and diode 50 function as a zero-crossing detector providing a substantially zero input voltage to the multivibrator 48 for those periods in which the output from the voltage-controlled filter 10 is positive and a positive input voltage to the multivibrator 48 for those periods in which the output from the voltage-controlled filter 10 is negative. This follows since the amplifier 26 provides a positive output voltage when the voltage connected with the positive terminal is more positive than the voltage connected with the negative terminal. Since resistor 32 connects the positive terminal with ground, the amplifier 26 provides a positive output only if the input voltage to the negative terminal is negative. When the output would otherwise be negative, the diode 50 constrains it to zero. When operational amplifier 26 indicates a positive output, monostable multivibrator 48 initiates a pulse at both the A and B outputs. Output A provides an output which is normally at a high value such that the pulse initiated by amplifier 26 is at a low value. Output B normally provides a low-value output, and the pulse is at a high value.

Transistor 60A of the amplifier 60 is provided a base bias to render it conductive only when the B output of multivibrator 48 is at a high output, in other words, transistor 60A is conductive at the start of each negative half-cycle of the output voltage from the voltage-controlled filter 10. Bias voltage is connected with the base of transistor 60B when transistor 60A is nonconductive, and when transistor 60A is conductive, the Zener diode 70 prevents any bias voltage from being applied to the base of transistor 60B and the transistor 60B is nonconductive during these intervals.

Field effect transistor 38 is provided a gate signal when transistor 60B is nonconductive. Hence, the capacitor 40 samples the voltage on capacitor 30 each cycle of the voltage output from the voltage-controlled filter 10. This sampling occurs at the beginning of the negative half-cycle when the transistor 60B is nonconductive. When transistor 60B is conductive, the field effect transistor 38 is essentially an open circuit isolating capacitor 40 from capacitor 30.

Monostable multivibrator 56 provides a pulse each cycle to bias transistor 76 conductive to discharge capacitor 30 to reset it to sense the voltage of the succeeding cycle. The output of the multivibrator 56 is normally at a low value being at a high value during the pulse. The pulse output from multivibrator 56 is initiated by the leading edge of an input pulse connected from the output A of multivibrator 48. In the system of FIG. 2, the termination of the pulse of output A of multivibrator 48 causes a rising signal which is connected with multivibrator 48 to trigger the multivibrator 56. This signal is delayed by the RC charging circuit comprised of resistor 54 and capacitor 58. This delay ensures that the field effect transistor 38 is nonconductive prior to the time capacitor 30 is discharged.

To summarize the operation to this point, each of the following operations is performed each cycle by the sample and hold circuit or peak voltage detector. On the positive half-cycle of the voltage-controlled filter output voltage, amplifier 20 controls the current amplifier 36 to charge the capacitor 30 to the peak positive voltage of the output voltage. Operational amplifier 26 causes multivibrator 48 to initiate two output pulses at the beginning of the negative half-cycle after capacitor 30 is fully charged. One of the output pulses causes transistor 60B to switch to its nonconductive mode to cause field effect transistor 38 to connect capacitor 30 with capacitor 40. Capacitor 40 is, accordingly, charged substantially to the voltage of capacitor 30. After the field effect transistor 38 ceases conduction, the second pulse from multivibrator 48 is effective to cause multivibrator 56 to initiate a pulse biasing the transistor 76 conductive to discharge the capacitor 30. Capacitor 40 is continually connected with the high input impedance operational amplifier 44 and this amplifier provides an output voltage which follows the voltage of capacitor 40.

Operational amplifier 47 is provided an error signal representative of the difference between the magnitude of the voltage output of operational amplifier 44 and the magnitude of a reference voltage. The reference voltage is developed by applying the negative bias voltage to a potentiometer 80. The tap point voltage is connected through resistor 82 with the voltage from amplifier 44 which is connected through resistor 46 to the negative terminal of amplifier 47. A resistor 84 connects the positive terminal of the amplifier 47 with ground. A resistor 86 determines the gain of the amplifier 47 and diode 88 precludes negative output voltages while Zener diode 90 limits the amplitude of the positive voltage at the output of amplifier 47. The gain of the amplifier is selected to be high, for example, on the order of 50 or more.

A conductor 92 connects the control signal thus developed at the output of operational amplifier 47 with the voltage controlled filter 10. Accordingly, the characteristic response of the voltage-controlled filter 10 is determined by the amplified error signal provided by the circuit described at the output of operational amplifier 47.

Figure 3:
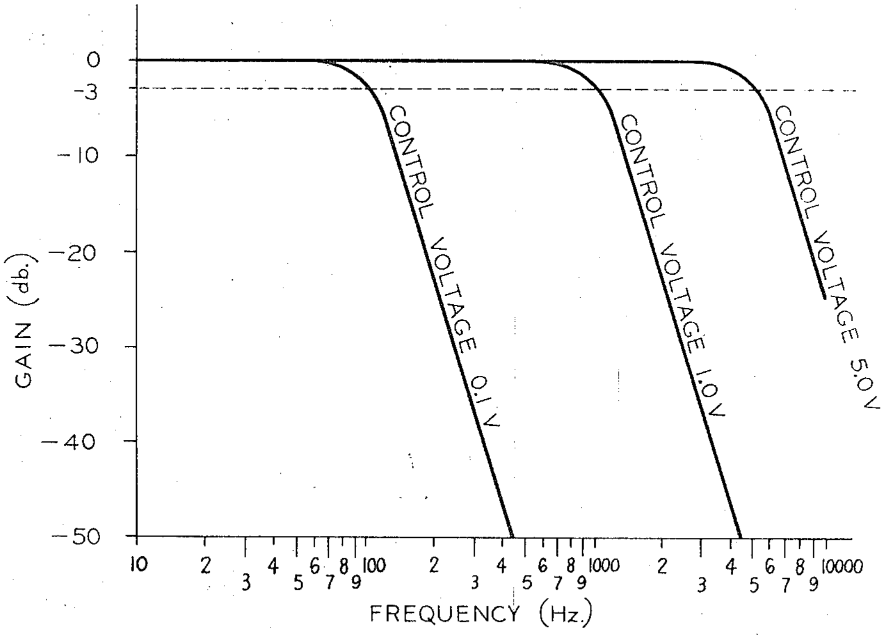
FIG. 3 shows graphically the characteristic response of the voltage-controlled filter included in FIGS. 1 and 2 and displays the dependence of the response on the control voltage.
Figure 4:
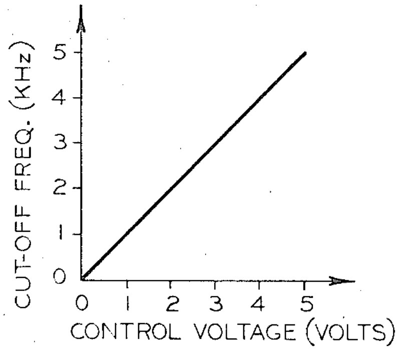
FIG. 4 is a graph relating the cutoff frequency of the voltage-controlled filter of FIGS. 1 and 2 with the control voltage applied to its control terminals.

FIG. 3 shows a graph summarizing the characteristic response of the voltage-controlled filter 10 of FIGS. 1 and 2. As shown in this graph, the characteristic response of the filter depends on the control voltage applied to the filter. Each control voltage yields a distinct characteristic response or transfer curve relating the voltage at the output terminals of the filter with the voltage at the input terminals of the filter. Inasmuch as the filter is a nonamplifying network, the gain is represented in terms of attenuation. The −3 db. point is defined as the cutoff for the transfer curve associated with a particular control voltage. Viewed in this light, the family of transfer curves is seen to define a continium of cutoff frequencies related on a one-to-one basis with the continium of control voltages. This relationship is shown graphically in FIG. 4 where the cutoff frequency is plotted against control voltage.

In the graph of FIG. 3, it is apparent that a discrete jump in control voltage produces a discrete jump in the cutoff frequency of the voltage controlled filter. Thus, the characteristic response of the voltage controlled filter is dependent on the particular transfer curve the filter is operating on, which in turn, is dependent on the instantaneous control voltage.

The operation of the frequency following and automatic gain control aspects of this invention are most readily comprehended by a consideration of FIG. 3. First, the gain control feature will be explained. For the purposes of the description of the automatic gain control feature, a constant frequency square wave input signal is assumed. The filter, accordingly, extracts the fundamental frequency sinusoidal component of the square wave input signal. The reference potential is selected as substantially the voltage available from the detector at a desired output voltage level and is assumed to correspond with the voltage at the −3 db. point for the preselected frequency when the square wave input has a predetermined nominal amplitude.

When the output is at the nominal amplitude associated with the input nominal amplitude, the output is slightly different from the reference voltage, and the error signal developed therefrom is the control voltage required by the voltage controlled filter to continue stable operation. In view of the large gain provided by amplifier 47, the reference voltage and the output voltage are substantially equal at this operating point. Assume that the input voltage is increased in amplitude, the output voltage likewise has an increase in amplitude. When the output voltage increases in amplitude, the signal available for comparison with the reference voltage is larger relative to the reference voltage than prior to the increase and a reduction in the control voltage results. This reduced control voltage is in turn connected with the control electrodes of the voltage-controlled filter and the predetermined operating curve of the voltage-control filter shifts such that the attenuation at the operating frequency is increased. This increased attenuation reduces the output voltage and stability is restored at the new input voltage amplitude. It should be appreciated that the shift described provides control of the amplitude of the output signal and minimizes the effect of an increase in amplitude by the input voltage.

Considering the situation in which the voltage amplitude at the input decreases, it should be appreciated that the concomitant shift of the operating transfer curve will compensate and provide a constant voltage amplitude output. When the input voltage decreases, a decrease is effected in the output voltage. This decrease in output voltage is connected with the comparator and the increased error signal developed is amplified and connected with the voltage-controlled filter to shift the operating transfer curve to the right in FIG. 3 such that the attenuation at the predetermined operating frequency is reduced. This reduced attenuation ensures that the output voltage from the filter system is maintained substantially constant.

Changes in frequency by the input square wave signal connected with the voltage-controlled filter are compensated in much the same manner. To facilitate the following exposition, the input voltage is assumed to have a constant amplitude but a varying frequency. The fundamental sinusoidal component of the square wave should be appreciated as varying in frequency with the frequency of the square wave. If other periodic waveforms were connected at the input, the same description of the operation obtains as that set out for the present example. The reference voltage and the nominal operating point are selected in a manner analogous to that for the varying amplitude example above. Thus, the cutoff frequency of the transfer curve defining the operation of the voltage controlled filter will correspond to the preselected nominal frequency of the input voltage.

If the frequency of the input signal increases, the output signal will have a reduced amplitude since the attenuation is greater for the higher frequency. This reduced output voltage results in a larger error signal and, accordingly, the transfer curve defining the voltage controlled filter's operation shifts to the right on the graph of FIG. 3 to provide a constant amplitude output. The cutoff frequency of the new transfer curve defining the response of the voltage-controlled filter will correspond to the new input frequency having assumed a constant amplitude.

On the other hand, when the input frequency decreases, the amplitude of the output voltage increases and a smaller control voltage is applied to the voltage controlled filter to move the transfer curve defining the voltage-controlled filter's operation to the left in FIG. 3. Accordingly, the cutoff frequency of the transfer curve of the new control voltage has a value substantially equal to the frequency of the new input voltage.

It should be appreciated that in actual operation both frequency and amplitude can be compensated simultaneously. Additionally, it is noted that the −3 db. operating point assumed for the examples is merely exemplary with the choice of operating point open to selection.

Figure 5:
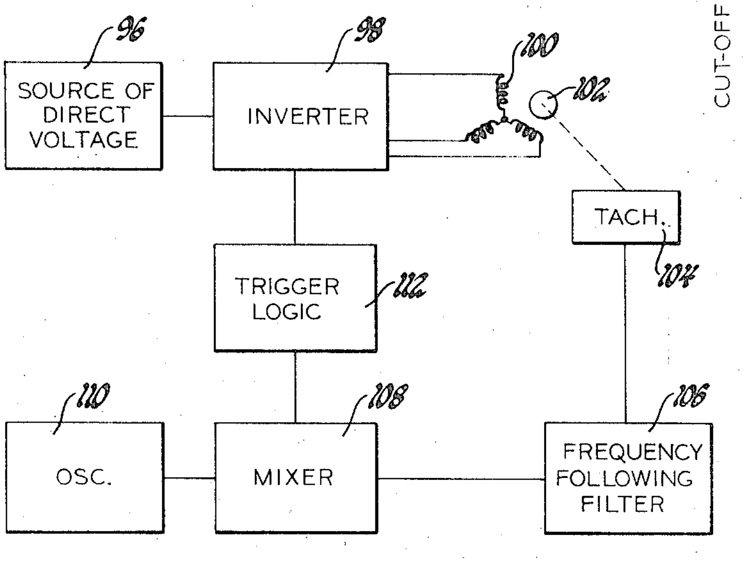
FIG. 5 is an AC motor slip speed control system incorporating the frequency following filter of the instant invention.

FIG. 5 is a block diagram schematic of an AC induction motor slip speed control system which uses the frequency following filter arrangement of this invention. A source of direct voltage 96 is connected through a controlled rectifier inverter 98 with the three-phase windings of an AC induction motor 100. The induction motor has a rotor 102 connected with a tachometer 104 to develop a periodic signal representative of the speed of rotation of the rotor. The output from this tachometer is connected with the frequency following filter 106 of this invention which has been described. The character of the periodic waveform available from the tachometer 104 can vary depending on the particular tachometer involved. It is assumed that the waveform has a square wave characteristic. The frequency following filter 106 extracts the fundamental sinusoid from this square wave and applies it to an electronic mixer 108. An auxiliary oscillator 110 provides a slip signal which is connected to the mixer 108. Oscillator 110 has a variable frequency, sinusoidal output to afford operator control of the system. The mixer 108 sums the two signals connected with it and connects this resultant signal to a trigger logic network 112. The trigger logic in turn supplies gating pulses to control the operation of controlled rectifiers in the inverter 98. Various known electronic mixer circuits can be used to fulfill the function of the mixer 108. The general idea of motor slip speed control is generally known and is further disclosed in the patent to Agarwal et al. U.S. Pat. No. 3,323,032.

From the foregoing, it should be appreciated that the filter arrangement of this invention extracts a fundamental frequency sinusoid from a periodic input signal. Amplitude measurements of the output from the filter are used to develop a control signal to continuously adjust the bias voltage supplied a voltage-controlled filter to effect this result. The system described also provides automatic gain control such that the amplitude of the output voltage is relatively insensitive to amplitude variations by the input voltage.

The motor control application of the present invention is merely one place where the novel character of the filter is useful. The above description has proceeded in terms of a particular embodiment without any intent to limit the scope of the present invention. It is appreciated that various modifications could be engrafted on the example within the scope of the appended claims.

I claim:

1. An electrical system for providing a sinusoidal output voltage from a periodic input voltage comprising: a voltage-controlled filter having input, output and control terminals, said input terminals being adapted for connection with an input electrical signal, said voltage-controlled filter having a frequency-dependent gain defined by a family of transfer curves relating the voltage at said output terminals to the voltage at said input terminals, said voltage-controlled filter operating on a predetermined transfer curve when a predetermined voltage is applied to said control terminals, each of said transfer curves defining a cutoff frequency for said filter whereby, the cutoff frequency of said filter is determined by the voltage applied to said control terminals, means for sensing the voltage amplitude at said output terminals, means providing a reference direct voltage, means responsive to said sensed voltage and said reference direct voltage for providing an error signal representative of the voltage amplitude difference between said sensed voltage and said reference direct voltage, and means for applying said error signal to said control terminals whereby, the cutoff frequency of said filter is regulated by said error signal and is maintained at predetermined instantaneous values which pass the instantaneous fundamental frequency of the voltage applied to the input of said filter.

2. A controlled filter system comprising: a voltage-controlled filter having input, output and control terminals, said input terminals being adapted for connection with an input electrical signal, said voltage-controlled filter having a frequency dependent gain defined by a family of transfer curves relating the voltage at said output terminals to the voltage at said input terminals, said voltage-controlled filter operating on a predetermined transfer curve when a predetermined voltage is applied to said control terminals, each of said transfer curves defining a cutoff frequency for said filter whereby, the cutoff frequency of said filter is determined by the voltage applied to said control terminals, means for sensing the voltage amplitude at said output terminals, means providing a reference direct voltage having an amplitude substantially equal to a preselected voltage amplitude at said output terminals, means for providing an error signal representative of the voltage amplitude difference between said sensed voltage amplitude and said reference direct voltage, and means connecting said error signal with said control terminals whereby, the cutoff frequency is lowered if the voltage amplitude at the output terminals increases and the cutoff frequency is raised if the voltage amplitude at the output terminals decreases such that the output voltage at said output terminals is maintained substantially constant at said preselected voltage amplitude level, said cutoff frequency being controlled in response to variations in the amplitude of the output voltage to provide a constant amplitude output signal having the frequency of the fundamental harmonic of the input electrical signal connected with the input terminals to the filter.

3. A frequency following filter system comprising: means providing a periodic input signal, a voltage-controlled filter having input, output and control terminals, means connecting said input signal with said input terminals, said voltage-controlled filter having a frequency dependent gain defined by a family of transfer curves relating the voltage at said output terminals with the voltage at said input terminals, said voltage-controlled filter operating on a predetermined transfer curve when a predetermined voltage is applied to said control terminals, each of said transfer curves defining a cutoff frequency for said filter whereby, the cutoff frequency of said filter is determined by the voltage applied to said control terminals, means for sensing the peak voltage amplitude at said output terminals, means providing a reference direct voltage having an amplitude substantially equal to a preselected peak voltage amplitude at said output terminals, means for providing an error signal representative of the voltage amplitude difference between said sensed voltage and said reference direct voltage, and means connecting said error signal with said control terminals whereby, the cutoff frequency of said voltage-controlled filter follows the frequency of said periodic input signal.

4. A method for extracting a constant amplitude first harmonic output signal from a periodic input signal comprising: providing a voltage-controlled filter having input, output and control terminals whose frequency dependent gain is defined by a family of transfer curves relating the voltage at said output terminals with the voltage at said input terminals, applying said periodic input signal to said input terminals, sensing the voltage at said output terminals, providing a reference direct voltage, generating an error signal representative of the voltage amplitude difference between said sensed voltage and said reference voltage, applying said error signal to said control terminals, and operating said voltage-controlled filter over a predetermined range near cutoff of a predetermined transfer curve when a predetermined voltage is applied to said control terminals such that the cutoff frequency of said voltage-controlled filter varies in conformity with both the amplitude and the frequency of said periodic input signal to provide said constant amplitude first harmonic output signal.

* * * * *